United States Patent
Corsi et al.

(10) Patent No.: US 6,741,129 B1
(45) Date of Patent: May 25, 2004

(54) DIFFERENTIAL AMPLIFIER SLEW RATE BOOSTING SCHEME

(75) Inventors: Marco Corsi, Parker, TX (US); James R. Hellums, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/324,271

(22) Filed: Dec. 19, 2002

(51) Int. Cl.[7] ............................................... H03F 3/45
(52) U.S. Cl. ........................ 330/252; 330/254; 327/359
(58) Field of Search ............................. 330/252, 254, 330/260; 327/359

(56) References Cited

U.S. PATENT DOCUMENTS

| | | | |
|---|---|---|---|
| 6,188,282 B1 * | 2/2001 | Montalvo | 330/260 |
| 6,304,143 B1 | 10/2001 | Corsi et al. | |
| 6,404,263 B1 * | 6/2002 | Wang | 327/359 |
| 6,605,994 B2 * | 8/2003 | Kim et al. | 330/252 |

* cited by examiner

*Primary Examiner*—Henry Choe
(74) *Attorney, Agent, or Firm*—Alan K. Stewart; W. James Brady, III; Frederick J. Telecky, Jr.

(57) ABSTRACT

A fully differential amplifier slew rate boosting scheme for use with an amplifier having a closed-loop gain very near unity or less has the first plates of the compensation capacitors 50 and 52 conventionally coupled to internal high impedance gain nodes 40 and 42, but has the other plates of the compensation capacitors 50 and 52 unconventionally driven with the input signal IN+ and IN−. The voltages appearing across the compensation capacitors 50 and 52 in response to changes in the input signal is significantly less than that achieved using conventional compensation architectures where the other plates of the compensation capacitors are coupled to ground. Since little current is now required to charge the compensation capacitors 50 and 52, the input stage tail current no longer limits the slew rate.

10 Claims, 2 Drawing Sheets

DIFFERENTIAL AMPLIFIER SLEW RATE BOOSTING SCHEME

BACKGROUND OF THE INVENTION

1. Field of the Invention

This invention relates generally to operational amplifier (op-amp) slew rate boosting schemes, and more particularly to a technique to boost the slew rate of a fully differential op-amp which has a closed-loop gain that is unity or less.

2. Description of the Prior Art

Fully differential folded cascode op-amps with a closed-loop gain that is unity or less are well known in the prior art. One such op-amp is illustrated in FIG. 1. The circuit of FIG. 1 includes input differential pair 20; transistors 22–25; output buffers 26 and 28; compensation capacitors 30 and 32; resistors 34 and 36; input resistors 44 and 45 (Ri); feedback resistors 46 and 47 (Rf); input nodes IN+ and IN−; tail current source $I_{tail}$; bias voltage $V_{bias}$; common mode feedback $V_{CMF}$; and output nodes OUT+ and OUT−. The output buffers 26 and 28 are typically class AB buffers. The equations, which govern the operation of the op-amp, are also very well known and have been documented by Paul R. Gray and Robert G. Meyer in *Analysis and Design of Analog Integrated Circuits*, pp. 646—onward, John Wiley & Sons, Inc., 3$^{rd}$ Edition. It has been shown that if the op-amp is to be made stable, one must control its unity gain crossing frequency. The conventional technique for controlling this unity gain crossing frequency is to use compensation capacitors 30 and 32 that couple nodes 40 and 42 to ground. The frequency where the open loop gain falls to unity for the op-amp is then defined as:

$$f_{unity} = \frac{G_m}{2\pi C_{comp}} \quad (1)$$

where $G_m$ is the transconductance of the input stage 20 and is determined by the tail current $I_{tail}$ shared by the input stage 20 transistors, and $C_{comp}$ is the capacitance value for capacitors 30 and 32. Specifically, $G_m$ is defined as:

$$Gm = \frac{qI_{tail}}{2kT} \quad (2)$$

The slew rate (maximum rate of change in output voltage for large input signals) for the op-amp is defined as:

$$Slewrate = \frac{I_{tail}}{C_{comp}} \quad (3)$$

where it is well known the compensation capacitance $C_{comp}$ must be set to a sufficiently large value in order to make the op-amp stable. Conventional op-amp compensation techniques provide a high small signal open loop voltage gain at a high output impedance at the op-amp gain node. This high output impedance in combination with the compensation capacitor then operates to place the dominant pole. When a conventional op-amp uses a compensation capacitor to achieve stability, all of the input stage tail current will flow into the compensation capacitor in response to a large step input voltage since one end of the compensation capacitor is coupled to the high impedance gain node while the opposite end of the compensation capacitor is coupled to an AC ground. The tail current will charge the compensation capacitor to achieve a slew rate defined by equation (3) above.

If more than two poles exist before the unity gain frequency $f_{unity}$ is reached, the op-amp will be unstable. Specifically the compensation capacitors 30 and 32 operate to push the first dominant pole down to a low enough frequency such that the op-amp gain falls below unity before the second pole is reached. Setting the value of compensation capacitance $C_{comp}$ to achieve the above desired stability characteristics therefore also establishes the maximum slew rate for the op-amp as set forth in equation (3) above. It is, of course, desirable to have a very high slew rate. In view of the foregoing, it can be appreciated that achieving a very high slew rate requires reducing the value of the compensation capacitance $C_{comp}$. Reducing the value of the compensation capacitance $C_{comp}$ however, makes the op-amp less stable since the first dominant pole will then be moved to a higher frequency as discussed herein before. The desired value of the compensation capacitance $C_{comp}$ and the desired high slew rate are therefore in direct conflict with one another.

One conventional technique used to address the direct conflict between the desired value of the compensation capacitance $C_{comp}$ and the desired high slew rate includes reducing the value of transconductance $G_m$ associated with the input stage 20 by inserting resistors into the emitter paths of the input stage 20 transistors. A lower value for the compensation capacitance $C_{comp}$ can then be used to achieve amplifier stability as seen by equation (1) above, which also then increases the slew rate as seen by equation (3) above. This technique however, is problematic in that the emitter resistors added to the emitter paths of the input stage 20 transistors introduce additional noise that cannot be tolerated in specific applications such as when the op-amp is driving a load that is connected to ground in response to an input signal such as might be used to accommodate ADSL systems.

In view of the foregoing, a need exists for a technique to boost the slew rate of fully differential amplifiers having a closed-loop gain of close to unity or less without introducing additional noise into the system.

SUMMARY OF THE INVENTION

The fully differential amplifier slew rate boosting scheme for use with an amplifier having a closed-loop gain very near unity or less has the first plates of the compensation capacitors conventionally coupled to internal high impedance gain nodes, but has the other plates of the compensation capacitors unconventionally driven with the input signal. The voltages appearing across the compensation capacitors in response to changes in the input signal is significantly less than that achieved using conventional compensation architectures where the other plates of the compensation capacitors are coupled to ground. Since little current is now required to charge the compensation capacitors, the input stage tail current no longer limits the slew rate.

DETAILED DESCRIPTION OF THE PREFERRED EMBODIMENTS

Figure 1:
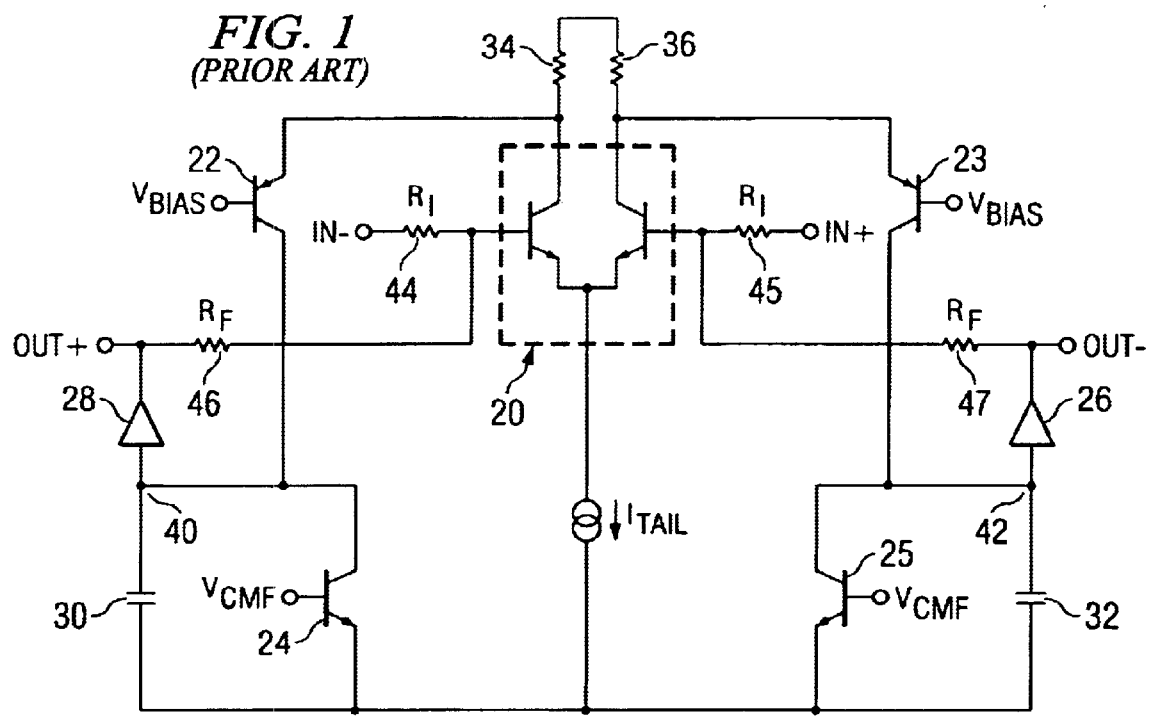
FIG. 1 is a schematic diagram illustrating a voltage mode filly differential folded cascode operational amplifier suitable for unity gain applications.

Looking now at FIG. 1, a simplified schematic diagram illustrates a voltage mode fully differential operational amplifier suitable for unity gain applications. The slew rate of a voltage mode amplifier such as shown in FIG. 1 is generally limited by the input tail current $I_{tail}$ the size of the compensation capacitors 30 and 32, as stated herein before. The operation of amplifier is governed by equations (1)–(3). The compensation capacitors 30 and 32, as also stated above, are chosen so that the unity gain bandwidth of the amplifier is low enough so that the amplifier 100 does not oscillate when in closed loop. To increase the slew rate therefore, one needs to decrease the value of the compensation capacitors 30 and 32. One method of increasing slew rate is reducing the input transconductance $G_m$ by resistive degeneration. This allows one to decrease the value of input transconductance $G_m$ while keeping the slewing current ($I_{tail}$) constant. This solution, while allowing much higher slew rates than that which can be obtained by typical methods, is problematic in that it introduces noise into the system.

Figure 2:
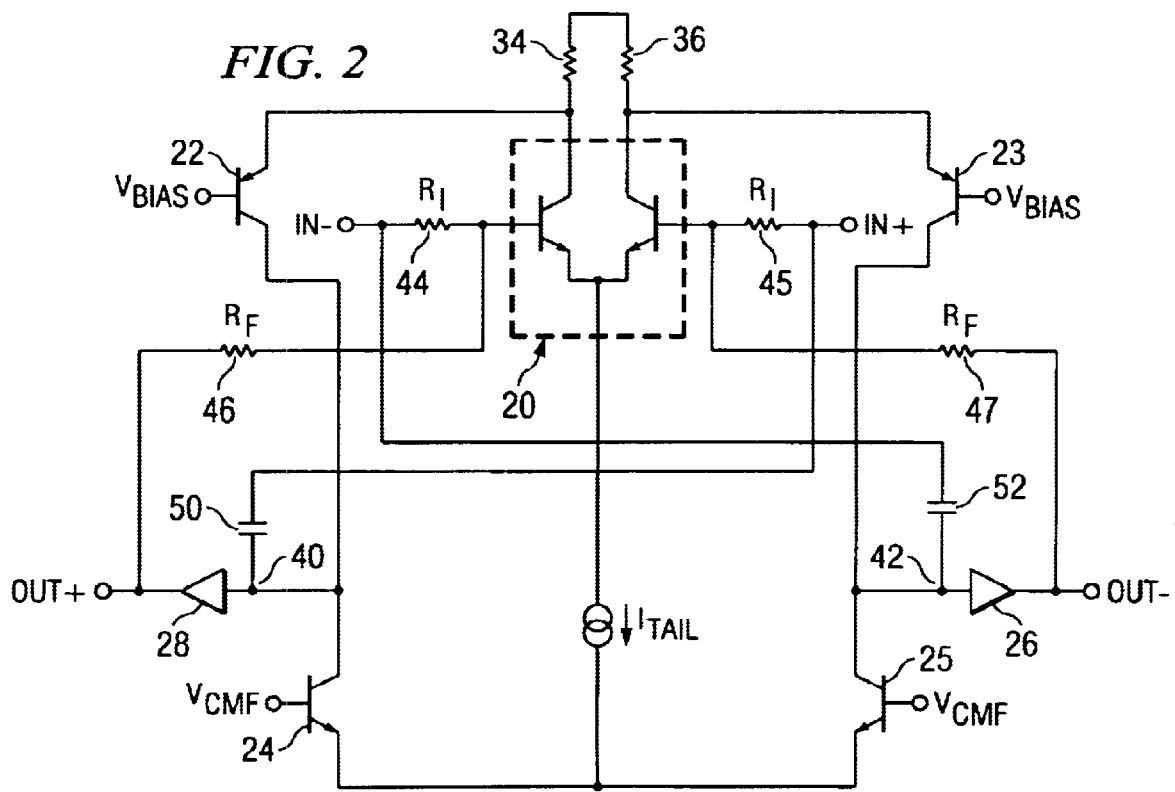
FIG. 2 is a schematic diagram illustrating a slew rate boosted unity gain amplifier according to a first embodiment of the present invention.

Moving now to FIG. 2, a simplified schematic diagram illustrates a slew rate boosted amplifier suitable for unity gain applications according to a first embodiment of the present invention. In an application where the closed-loop gain of the amplifier is close to unity and the amplifier is of the type where a transconductance $G_m$ is routed into compensation capacitors 50 and 52 followed by unity gain output stages 26 and 28, the voltage at the input to the output stages 26 and 28 are similar in magnitude to the input signals at nodes IN+ and IN–. The unity gain output stages 26 and 28 can be seen to be class 'AB' buffer amplifiers. The nature of the present invention is to drive both ends of compensation capacitors 50 and 52 with a nearly identical signal. Specifically, one end of compensation capacitor 50 is coupled to node 40 (high impedance gain node) while the opposite end is coupled to input node IN+, and one end of compensation capacitor 52 is coupled to node 42 (high impedance gain node) while the opposite end is coupled to input node IN–. For a unity gain configuration, the voltage signals across compensation capacitors 50 and 52 are much smaller than across compensation capacitors 30 and 32 in the prior art circuit of FIG. 1. These voltages can be on the order of 100 times lower than in the prior art circuit of FIG. 1. The current flowing from the input stage 20, in FIG. 2, is therefore not the limiting factor in the slew rate of the amplifier, and is now available instead to drive the parasitic capacitances within the amplifier and to help reduce non-linearities.

From a small signal stability point of view, the amplifier in FIG. 2 is very similar to the amplifier shown in FIG. 1. The input stage 20, for example, still needs to charge and discharge the compensation capacitors 50 and 52, but now with a much reduced stewing requirement. The compensation capacitors 50 and 52 are therefore no longer the limiting factor regarding amplifier slew rate. In fact, it feeds the signal forward of its input. The input stage needs only to linearize any remaining errors as a result of distortion in the output buffers (26 and 28) and to charge any parasitic capacitances that may exist.

In summary explanation, a slew rate boosting scheme is implemented for fully differential amplifiers having a closed-loop gain that is equal to unity or close to unity. The scheme has one side of the compensation capacitors conventionally coupled to a high impedance gain node while the opposite side of the compensation capacitors are unconventionally driven with the input signal to the amplifier such that the voltage signals appearing across the compensation capacitors are significantly less than that achieved using conventional compensation architectures where the opposite side of the compensation capacitors are coupled to ground. The value of the compensation capacitors is no longer a significant factor affecting the amplifier slew rate since the tail current generated by the input stage is no longer required to charge the compensation capacitors to achieve a voltage difference between the signal voltage and ground. The tail current is now available to charge any parasitic capacitance within the amplifier, therefore boosting its slew rate.

Figure 3:
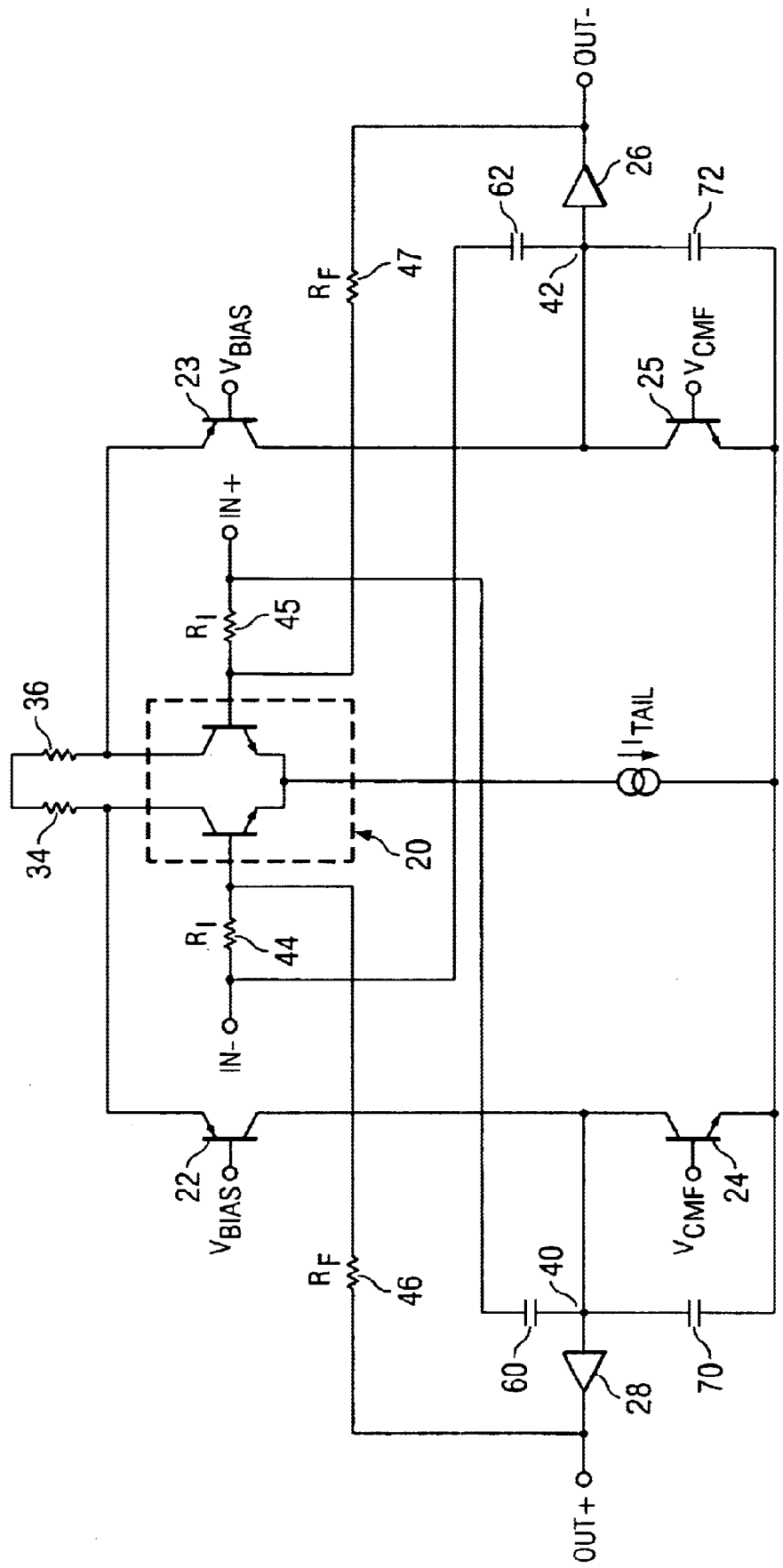
FIG. 3 is a schematic diagram illustrating a slew rate boosted amplifier for gain of less than unity according to a second embodiment of the present invention.

Moving now to FIG. 3, a simplified schematic diagram illustrates a slew rate boosted amplifier suitable for applications where the closed loop gain is less than unity, according to a second embodiment of the present invention. The circuit of FIG. 3 has compensation capacitors 60 and 62 configured the same as compensation capacitors 50 of 52 of FIG. 3, but the circuit of FIG. 3 has additional capacitors 70 and 72 that are coupled to ground. When the gain of the amplifier is less than unity, the input voltages at nodes IN+ and IN– are larger than the voltages at nodes 40 and 42. As the gain moves further below unity, the benefits gained by the capacitor configuration of FIG. 2 become less. In order to correct for this, compensation capacitors 70 and 72 have been added to the circuit of FIG. 3. This capacitor configuration effectively forms a voltage divider that matches the gain of the closed loop amplifier:

$$C_A/(C_A+C_B)=G_A \qquad (4)$$

where $C_A$ is the value of capacitors 60 and 62, $C_B$ is the value of capacitors 70 and 72, and $G_A$ is the gain of the closed loop amplifier.

For an example of how the values of capacitors 60, 62, 70, and 72 are determined, feedback resistors Rf and input resistors Ri are shown in FIG. 3. The gain of the circuit of FIG. 3 is Rf/Ri. The value of compensation capacitors 60, 62, 70, and 72 of FIG. 3 are determined by the voltage divider equation:

$$C_A/(C_A+C_B)=Rf/Ri \qquad (5)$$

The feedback resistors Rf and input resistors Ri are shown as an example. Other devices including both resistors and capacitors can be used for the feedback and input devices.

In view of the above, it can be seen the present invention presents a significant advancement in the art of slew rate boosting schemes for fully differential amplifiers having a gain of close to unity or less. Further, this invention has been described in considerable detail in order to provide those skilled in the data communication art with the information needed to apply the novel principles and to construct and use such specialized components as are required. In view of the foregoing descriptions, it should further be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims, which follow. For example, although various embodiments have been presented herein with reference to particular transistor types, the present inventive structures and characteristics are not necessarily limited to particular transistor types or sets of characteristics as used herein. It shall be understood the embodiments described herein above can easily be implemented using many diverse transistor types so long as the combinations achieve a slew rate boosting scheme for fully differential amplifiers having a closed-loop gain close to unity or less, according to the inventive principles set forth herein above.

What is claimed is:

1. A slew rate boosted fully differential amplifier comprising:
   an input stage having first and second differential inputs, wherein the input stage is operative to generate first and second differential charging currents in response to an input signal;
   a first high impedance gain node operative to receive the first differential charging current;
   a second high impedance gain node operative to receive the second differential charging current;
   a first compensation capacitor having one plate coupled to the first high impedance gain node and having its opposite plate coupled to the second differential input, wherein substantially none of the first differential charging current is required to charge the first compensation capacitor;
   a second compensation capacitor having one plate coupled to the second high impedance gain node and having its opposite plate coupled to the first differential input, wherein substantially none of the second differential charging current is required to charge the second compensation capacitor;
   a first output buffer coupled to the first high impedance gain node; and
   a second output buffer coupled to the second high impedance gain node.

2. The device of claim 1 wherein the amplifier is configured to have unity closed-loop gain.

3. A slew rate boosted fully differential amplifier comprising:
   an input stage having first and second differential inputs, wherein the input stage is operative to generate first and second differential charging currents in response to an input signal;
   a first high impedance gain node operative to receive the first differential charging current;
   a second high impedance gain node operative to receive the second differential charging current;
   a first compensation capacitor having one plate coupled to the first high impedance gain node and having its opposite plate coupled to the second differential input, wherein substantially none of the first differential charging current is required to charge the first compensation capacitor;
   a second compensation capacitor having one plate coupled to the second high impedance gain node and having its opposite plate coupled to the first differential input, wherein substantially none of the second differential charging current is required to charge the second compensation capacitor;
   a third compensation capacitor having one plate coupled to the first high impedance gain node and having its opposite plate coupled to ground; and
   a fourth compensation capacitor having one plate coupled to the second high impedance gain node and having its opposite plate coupled to ground.

4. The device of claim 3 wherein the amplifier is configured to have less than unity closed-loop gain.

5. The device of claim 3 further comprising:
   a first output buffer coupled to the first high impedance gain node; and
   a second output buffer coupled to the second high impedance gain node.

6. A differential amplifier comprising:
   a differential input pair having first and second inputs;
   a first current path from a first branch of the differential input pair for providing a first current;
   a second current path from a second branch of the differential input pair for providing a second current;
   a first compensation capacitor having a first plate coupled to the first current path and a second plate coupled to the second input, such that substantially none of the first current is required to charge the first compensation capacitor;
   a second compensation capacitor having a first plate coupled to the second current path and a second plate coupled to the first input, such that substantially none of the second current is required to charge the second compensation capacitor; and
   a first output buffer coupled to the first plate of the first compensation capacitor; and
   a second output buffer coupled to the first plate of the second compensation capacitor.

7. The device of claim 6 further comprising:
   a first transistor coupled in the first current path between the differential input pair and the first compensation capacitor; and
   a second transistor coupled in the second current path between the differential input pair and the second compensation capacitor.

8. The device of claim 7 further comprising:
   a third transistor coupled between the first transistor and ground, and being controlled by a common mode feedback node; and
   a fourth transistor coupled between the second transistor and ground, and being controlled by the common mode feedback node.

9. The device of claim 6 further comprising:
   a third compensation capacitor having a first plate coupled to the first plate of the first compensation capacitor and a second plate coupled to ground; and
   a fourth compensation capacitor having a first plate coupled to the first plate of the second compensation capacitor and a second plate coupled to ground.

10. The device of claim 9 wherein the first and second compensation capacitors have a capacitance of Ca and the third and fourth compensation capacitors have a capacitance of Cb, wherein Ca/(Ca+Cb) is equal to a closed loop gain of the amplifier.

* * * * *